United States Patent [19]
Nguyen et al.

[11] Patent Number: 6,012,839
[45] Date of Patent: Jan. 11, 2000

[54] METHOD AND APPARATUS TO PROTECT DATA WITHIN A DISK DRIVE BUFFER

[75] Inventors: Hung C. Nguyen, San Jose; Andrew D. Hospodor, Los Gatos, both of Calif.

[73] Assignee: Quantum Corporation, Milpitas, Calif.

[21] Appl. No.: 08/497,488

[22] Filed: Jun. 30, 1995

[51] Int. Cl.[7] .................................................. H03H 13/00
[52] U.S. Cl. ...................... 371/37.4; 371/37.5; 371/39.1
[58] Field of Search .................................... 371/37.1, 37.4, 371/37.5, 40.1, 40.2, 40.3, 40.4, 38.1, 39.1, 22.1, 22.6, 22.3, 22.4, 22.5

[56] References Cited

U.S. PATENT DOCUMENTS

| | | | |
|---|---|---|---|
| 4,780,809 | 10/1988 | Woffinden et al. | 364/200 |
| 5,038,349 | 8/1991 | Lipp | 371/22.6 |
| 5,065,090 | 11/1991 | Gheewale | 371/25.1 |
| 5,182,752 | 1/1993 | DeRoo et al. | 371/37.7 |
| 5,241,546 | 8/1993 | Peterson et al. | 371/37.5 |
| 5,283,791 | 2/1994 | Halford | 371/40.4 |
| 5,384,786 | 1/1995 | Dudley et al. | 371/37.1 |
| 5,422,895 | 6/1995 | Nguyen et al. | 371/37.5 |
| 5,592,498 | 1/1997 | Zook | 371/40.1 |
| 5,602,857 | 2/1997 | Zook et al. | 371/40.1 |

FOREIGN PATENT DOCUMENTS

WO 89 02123   3/1989   WIPO .

*Primary Examiner*—Reba I. Elmore
*Assistant Examiner*—Thomas E Brown
*Attorney, Agent, or Firm*—David B. Harrison; Debra A. Chun

[57] ABSTRACT

An architecture that utilizes the cross-check code associated with the error correction code in a data communications system as a data integrity code to protect data stored in a temporary storage buffer within a data channel. In a preferred embodiment, a cross-check encoder and comparison circuit is added to an interface circuit which receives data from a host processing system. Incoming host data is encoded to produce redundant information according to the same Reed-Solomon code implemented in the cross-check circuitry already provided in the data path to detect miscorrections by the error correction code. Cross-check redundancy generated by the interface cross-check encoder is appended to its associated data block in the block memory buffer. The integrity of the data blocks passing through the buffer is checked by utilizing the cross-check circuitry to regenerate the redundant cross-check bytes and then performing a comparison of the regenerated cross-check bytes with the cross-check bytes from the buffer. A similar process is repeated in the reverse path when the data blocks are recovered from a storage medium and delivered to the host through a path that includes the buffer.

28 Claims, 3 Drawing Sheets

METHOD AND APPARATUS TO PROTECT DATA WITHIN A DISK DRIVE BUFFER

FIELD OF THE INVENTION

The present invention pertains generally to the field of data coding methods and apparatus to protect blocks of data from erroneous transmission in data communication and storage systems. More specifically, the present invention pertains to a system architecture for applying a cross-check code associated with an error correction coding circuit within a data path in a data storage device as an error detection code by distributing the operation of the cross-check code across both sides of a block buffer memory array contained within the data path to protect data temporarily stored in the buffer.

BACKGROUND OF THE INVENTION

In digital data communication and storage systems, it is desirable to maintain the integrity of data throughout the entire data communication path; that is, from the moment data passes from the host or transmission source until it is safely received or stored, as well as in the reverse path back to the host or source. With respect to magnetic recording systems, in addition to providing a reliable read/write process to and from a degrading storage medium, such as a magnetic storage disk, the probability of reliable data transfer can be enhanced by providing error control over the entire read/write path, including intermediate points in the data path that are not protected by conventional ECC strategies.

Error detection and correction techniques typically rely on the use of some form of overhead redundancy that is appended to blocks of data during an encoding process to facilitate detection and correction of errors that occur during transmission of the block through a noisy data channel. The appended redundant information is typically generated from, and thus dependent upon, the precise bit pattern of the data block to be protected. When the encoded data blocks are received, the reliability of the transmission process may be checked by regenerating the redundant information from the received data block (using the same coding algorithm that was used to generate the redundancy information prior to transmission) and comparing the regenerated information with that which was originally appended. If the appended redundancy does not match the regenerated redundancy one or more data errors are assumed to have occurred. When this happens, a request can be made to either retransmit or reread the data or, in the case of codes having error correction capabilities, to locate and physically correct the data errors.

In modern magnetic storage systems, a main error correction code ("ECC") and implementing circuitry is typically used to detect and correct errors in data blocks that occur during the processes of reading and writing data to and from a storage surface of the magnetic medium itself. A cross-check code, which typically utilizes a different encoding algorithm from the ECC, has been used to check that any corrections carried out by the ECC are properly performed. An example of a disk drive data storage system that uses ECC and cross-check codes to perform on-the-fly error checking and correction is disclosed in commonly assigned U.S. Pat. No. 5,241,546 to Peterson et al., entitled "On-The-Fly Error Correction With Embedded Digital Controller." In commonly assigned U.S. Pat. No. 5,422,895, to Nguyen et al., entitled "Cross-Checking For On-The-Fly Reed-Solomon Error Correction Code," an improved cross-checking code and strategy is disclosed. As described in these patents, the disclosure of which is hereby incorporated by reference, the combination of ECC with cross-checking reduces the statistical probability of ECC miscorrection for a given ECC coding strategy. These ECC and cross-check codes, however, are limited in operation to the detection and correction of errors that are associated with the storage of information on the data degrading magnetic storage medium.

Accordingly, the chances of delivering error free data may be enhanced by extending error control to other parts of the data channel that are not protected by the main ECC and cross-check codes. In order to protect data from the moment it leaves the host until the time it is encoded (and hence protected) by the main ECC encoder/decoder ("ENDEC") prior to being written onto the storage medium, it is necessary to utilize additional coding strategies. Similarly, the data path back to the host from the storage medium should also be protected. Codes used to detect errors that occur on those portions of the data path, outside the protection of the ECC and cross-check codes are referred to herein as data integrity codes.

In the past, simple parity check codes or cyclical redundancy codes ("CRC") have been employed to protect data temporarily stored in a block memory buffer located in a data path between the host interface and the ECC circuitry. These codes typically involve appending a single parity bit to each byte of data with the state of the parity bit (i.e., "1" or "0") dependent on the data byte to be protected and the particular parity code used. With "odd" and "even" parity schemes, the parity bit is determined by adding up the number of "1's" (accomplished in practice by XORing consecutive bits) in the data symbol and appending either a "1" or a "0" to the symbol such that the total number of "1's" is either odd, in the case of odd parity, or even, in the case of even parity.

However, a well known weakness in parity codes is that they can only reliably detect single bit errors within a data symbol or block protected by the parity bit whereas multiple bit errors that offset each other with respect to the chosen parity go undetected. Moreover, since most RAM manufacturers no longer plan to supply 9 bit wide or 18 bit wide RAM chips, there is no longer data space available in the block buffer memory, typically a Dynamic Random Access Memory ("DRAM") store, to accommodate an extra parity bit. Thus, not only is there a need for a more powerful alternative to the simple parity check codes, but the ability to use these codes as a data integrity code in magnetic recording and other data communications systems employing RAM buffer memories is rapidly fading.

Cyclical redundancy codes offer an improvement over single bit parity codes in that they have the ability to detect multiple bit errors within a protected symbol or entire block of data. These codes are derived from some higher order combinations of bits within the symbol or block and may have multiple bits of redundancy. However, the use of a CRC to protect data in the block buffer memory involves adding CRC circuitry on both sides of the buffer.

As discussed above, error corrections made in accordance with the ECC may be cross-checked by a cross-check code to increase the overall reliability of the error correction process. The cross-check code disclosed in U.S. Pat. No. 5,422,895 to Nguyen et al. is a Reed-Solomon code that offers greatly increased error detection capabilities over traditional parity check and CRC codes.

Accordingly, it would be desirable to provide a system architecture that utilizes the existing cross-check code and hardware as a data integrity code to provide a more powerful alternative to existing buffer protection strategies. Such an architecture would constitute a major improvement over prior art parity check and CRC codes inasmuch as a more powerful data integrity strategy could be provided with minimal additional hardware.

SUMMARY OF THE INVENTION

A general object of the present invention is to provide a data integrity code and an associated hardware architecture to protect data temporarily stored in a block buffer memory array within a data path.

Another object of the present invention is to utilize the cross-check code associated with the ECC function and at least some of the existing cross-check encoder hardware to implement a data integrity code that protects data blocks temporarily stored in a block buffer memory within a data channel of a disk storage drive.

Another object of the present invention is to provide a cross-check encoder and comparison circuit in a host interface circuit of an peripheral storage device to implement a cross-check/data integrity code on both sides of a block buffer memory wherein the interface cross-check encoder implements the same coding algorithm utilized by the cross-check encoder associated with the ECC.

A more specific object of the present invention is to provide a cross-check/data integrity code and encoder implementation that operates over $GF(2^8)$ and generates two bytes of redundancy to protect each block of data passed through the buffer.

A related specific object of the present invention is to provide a cross-check/data integrity code characterized by a generator polynomial, $g(x)$, of the form: $x^2 + alpha^{134}x + alpha^1$ with the code operating over a GF(256) defined by the irreducible Galois field generator polynomial $p(x) = x^8 + x^4 + x^3 + x^2 + 1$ and a primitive $alpha^1$ element equal to 2B (hex).

In accordance with these and other objects, features, and aspects of the present invention, an architecture is provided that utilizes the existing ECC cross-check code as a data integrity code to protect data stored in a temporary storage buffer within a data storage device.

In a preferred embodiment, a cross-check encoder and comparison circuit is added to an interface circuit which receives data from a host processing system to provide, in conjunction with the cross-check encoder associated with the ECC, the capability to perform an integrity check of data that is temporarily stored in a block buffer memory located in the data path between these two encoders. The cross-check encoder in the host interface encodes incoming host data to generate redundant information according to the same Reed-Solomon code utilized by the cross-check encoder already provided within a multi-function sequencer/controller circuit to detect miscorrections by the ECC. The cross-check redundancy generated by the interface cross-check encoder is appended to the associated data block in the block memory buffer. The integrity of the data blocks passing through the buffer is checked by utilizing the ECC cross-check circuitry to regenerate the redundant cross-check redundancy. A comparison of the regenerated cross-check redundancy with the appended cross-check redundancy incoming from the buffer is then performed to detect errors in the data block.

The process may be repeated in the reverse path when the data blocks are recovered from a degrading storage medium and delivered to the host. In this case, the data blocks together with their appended cross-check redundancy are read from the storage medium and written to the buffer. If errors in the data or cross-check redundancy as recovered from the storage medium are determined to be present, they may be corrected in the buffer by the ECC prior to further processing. As each data block is passed from the buffer to the host its integrity is verified at the host interface by the combination of the cross-check encoder and comparison circuit in the interface by following the same process of regeneration and comparison used in the write path.

Thus, the preferred architecture provides a simple, yet elegant apparatus and associated method for protecting data within a data block buffer by extending the use of the existing cross-check code to the interface side of the buffer as a data integrity code. Using this approach significant hardware savings over prior strategies for protecting buffered data can be realized, while at the same time providing a more powerful Reed-Solomon based error detection than was available with prior strategies. This dual use of the cross-check code facilitates an architecture that requires very little additional hardware, other than the duplication of the encoder portion of the ECC cross-check circuit in the interface circuit, to provide data integrity checking capability for data stored in the buffer.

These and other aspects, features, objects and advantages of the present invention will be more fully understood and appreciated upon consideration of the following detailed description of a preferred embodiment of the invention, presented in conjunction with the accompanying drawings, wherein like numerals designate corresponding parts in the several figures.

DETAILED DESCRIPTION OF A PREFERRED EMBODIMENT

Figure 1:
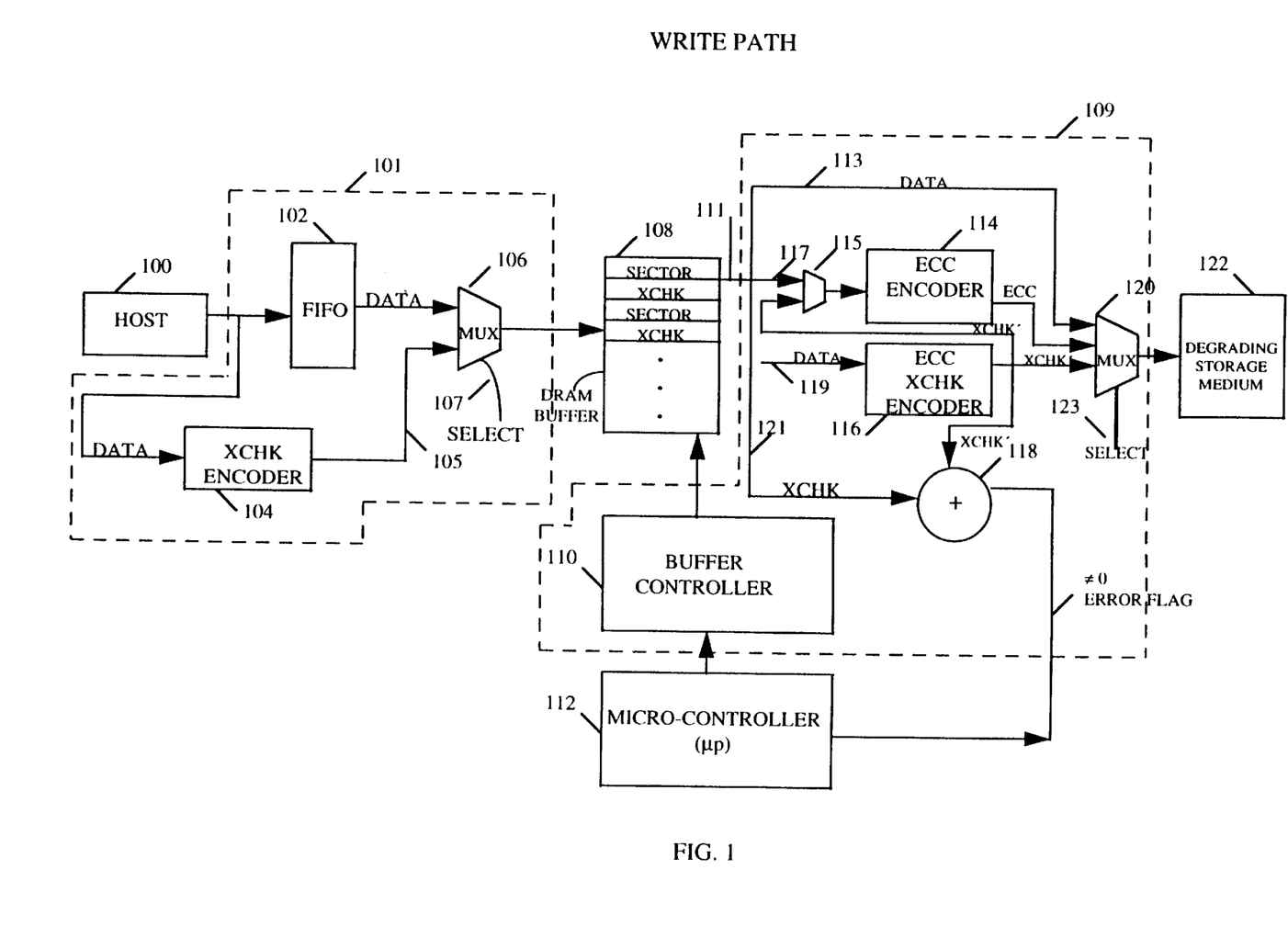
FIG. 1 is a top level block diagram of the write path in a magnetic storage device incorporating an architecture according to the invention that utilizes the ECC cross-check code to protect blocks of data stored in a temporary block memory buffer within the write path.
Figure 2:
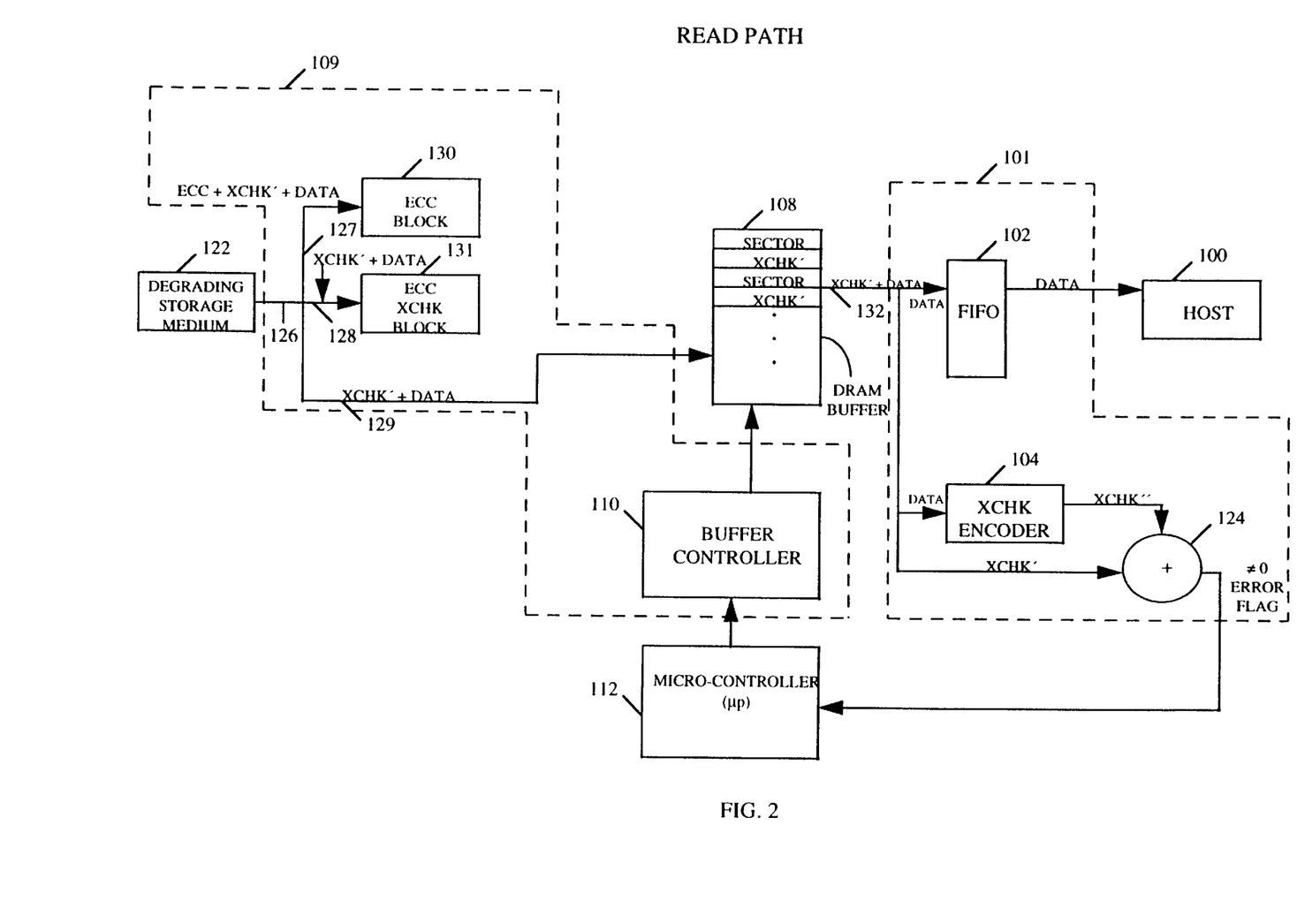
FIG. 2 is a block diagram similar to FIG. 1, illustrating the system architecture for protecting data stored in a block memory buffer in the read path of the data channel, in accordance with the invention.

An exemplary system architecture that utilizes a cross-check code to protect data stored in a data buffer within a bi-directional data path in a data storage device is illustrated in FIGS. 1 and 2. It should be understood that in practice the read and write paths illustrated in respective FIGS. 1 and 2, form a single bi-directional data path between a host computing system 100 and a storage medium 122. The read and write paths are illustrated separately only to facilitate description of the system operation with respect to the respective data paths. To further facilitate the description, circuit elements that are common to both the read and write paths are indicated by the same reference numbers in the respective figures. And, the prime (') and double prime (") notations are used in connection with the appended cross-check redundancy to indicate the regeneration of the redundancy at different source points within the illustrated data paths.

Referring now to FIG. 1, data from a host computing system 100 passing into host interface 101 (indicated by the dashed box) is transmitted along two separate data paths which provide the inputs to a shift register, which is preferably a first-in-first-out ("FIFO") shift register 102, and an interface cross-check encoder 104 (labeled "XCHK" in the figures). Communications between the host 100 and host interface 101, which may be an SCSI or IDE interface for example, are established according to the communications protocol associated with the particular host interface 101. Although the interface cross-check encoder circuitry 104 may be implemented remotely from the interface 101, it is preferably formed within the interface 101 as part of a custom ASIC package. The data path into the interface 101 may be switched between an 8 and 16 bit wide path to accommodate either byte or word size formatting of data from the host 100.

The data bytes that comprise each block of data are sequentially clocked into the cross-check encoder 104 in accordance with a byte clock signal applied to the encoder 104 in conventional fashion. Concurrently therewith, the data bytes are also sequentially clocked into and out of FIFO 102 and passed through multiplexer 106 to temporary storage DRAM buffer 108. Significantly, while the data blocks described herein are formatted in bytes (i.e., 8 bit symbols), many different block formatting options, both in terms of block sizes as well as symbol sizes, e.g., 10 or 16 bit symbols, may be used depending on the application. Of course, use of different data symbol sizes requires the use of appropriate coding equations and concomitant hardware.

Returning now to the description of the write path in FIG. 1, buffer 108 receives the data bytes under the control of buffer controller 110 which, in turn, is supervised by an on-board micro-controller 112. After all the bytes in the block of data to be protected by the cross-check/data integrity code have been clocked through the FIFO 102 and the encoder 104, the encoder 104 clocks out the generated redundancy bytes (labeled XCHK in the figure) on line 105 which provides a path from the encoder to the multiplexer 106. During the same clock cycles when the XCHK redundancy bytes are clocked out the encoder 104, the select line 107 on the multiplexer 106 changes states such that the output XCHK redundancy is passed through the multiplexer 106 and appended to its associated data block stored in buffer 108. In FIGS. 1 and 2, the buffer 108 is illustrated as holding a number of sector size, i.e., 512 byte, data blocks with each data block having its associated redundancy appended thereto to form a complete buffer data code word. It should be appreciated that the size of the data blocks may vary according to the application and that a block size of 512 bytes is merely illustrated as a typical example in a disk drive storage system.

The encoder 104 preferably encodes the data to produce redundant information according to the same Reed-Solomon code implemented in the cross-check encoder 116 utilized to detect miscorrections by the ECC. According to a presently preferred encoding algorithm, two bytes of data integrity/cross-check redundancy are appended to each data block that is stored in the buffer 108. An exemplary and presently preferred cross-checking code which may also be utilized as a data integrity code as taught herein is disclosed in U.S. Pat. No. 5,422,895 to Nguyen et al. This cross-check code has a generator polynomial of the form:

$$G_{xc}(x) = (x + alpha^1)(x + alpha^0)$$
$$= (x + alpha)(x + 1)$$
$$= x^2 + alpha^{134}x + alpha^1.$$

The Reed-Solomon encoder 104 that implements this code produces two check bytes for each block of data stored in the buffer 108. Mathematical operations for this code are performed according to the rules of Galois field arithmetic over a Galois field with 256 elements (GF(256) or GF($2^8$)). A presently preferred GF(256) is defined by a primitive alpha$^1$ element equal to 2B (hex) and its irreducible generator polynomial, p(x)=$x^8$+$x^4$+$x^3$+$x^2$+1. The log and antilog tables for this Galois field are disclosed in the U.S. Pat. No. 5,422,895 to Nguyen et al.

After the cross-check bytes, XCHK, have been appended to the data block stored in the buffer 108, these stored code words (i.e., data sectors plus appended XCHK bytes) are sequentially clocked out of the buffer 108 over a path 111 to a sequencer/controller circuit 109 (indicated by the dashed box) under the control of the buffer controller 110 and supervisory micro-controller 112. The sequencer/controller 109 includes an ECC encoder circuit 114, an ECC cross-check generation circuit 116, a comparison circuit 118, and a multiplexer 120. As illustrated in FIGS. 1 and 2, the buffer controller 110 is preferably included within the sequencer/controller 109 circuitry as part of a custom ASIC design.

Once inside the sequencer/controller 109, the incoming data path 111 splits into four parallel paths labeled 113, 117, 119, and 121, respectively. On the first path, 113, the data bytes of the data block (512 in the present example) from the buffer 108 are sequentially clocked through multiplexer 120 and passed to a data transducing head (not shown) that serially writes the data bits onto the degrading storage medium 122 in conventional fashion. At the same time the data bytes are clocked through multiplexer 120, they are also sequentially clocked into the ECC encoder circuit 114 over path 117 through multiplexer 115, and into the ECC cross-check encoder circuit 116 over data path 119.

The ECC cross-check encoder 116 produces cross-check redundancy bytes, XCHK', in response to the data input into the circuit over path 119. These cross-check bytes are preferably generated using the same generator polynomial and implementing encoder circuitry that was used to generate the cross-check bytes, XCHK, in the XCHK encoder 104 at the interface circuit 101. As previously described, a presently preferred cross-check encoder produces two bytes of cross-check redundancy according to the generator polynomial $G_{xc}(x)=x^2+alpha^{134}x+alpha^1$.

In the present example, after the entire 512 byte data sector has been sequentially clocked through the ECC cross-check encoder 116, the two XCHK' bytes, are clocked out over the next two byte clock cycles and input to the ECC encoder 114 through multiplexer 115. These XCHK' bytes are also input to the multiplexer 120 and to one input of the comparison circuit 118. The comparison circuit 118 is shown in FIG. 1 as an adder circuit which performs a bitwise XOR operation on the incoming XCHK and XCHK' bytes. In practice, the comparison circuit 118 may be implemented as a parallel bitwise XOR gate array as is well known to those of skill in the art.

During the two byte clock cycles when the XCHK' bytes are clocked out of the cross-check encoder 116, the select line 123 of the multiplexer 120 changes states to permit the XCHK' bytes to be passed through the multiplexer 120 and written to the degrading storage medium 122 where they are appended to the data sector previously written. At the same time the XCHK' bytes are written to the degrading storage medium 122, the select line (not shown) of the multiplexer 115 also changes states to permit the XCHK' bytes to pass to the input of the ECC encoder 114.

The ECC encoder circuit 114 generates a predetermined number of ECC check bytes representative of the data bytes and, in the present example, the cross-check bytes. Data from the buffer 108 enters the ECC encoder 114 on the path 117 through multiplexer 115. After all the data bytes have been clocked through the encoder 114, the newly generated XCHK' bytes are input into the ECC encoder 114 through multiplexer 115, as previously explained. Thus, the ECC check bytes generated by the ECC encoder 114 cover both the data bytes and the appended cross-check bytes recorded on the medium 122, providing the capability to correct errors that occur in the cross-check bytes as well as the data bytes. The significance of this capability with respect to the read path will be explained shortly.

Figure 3:
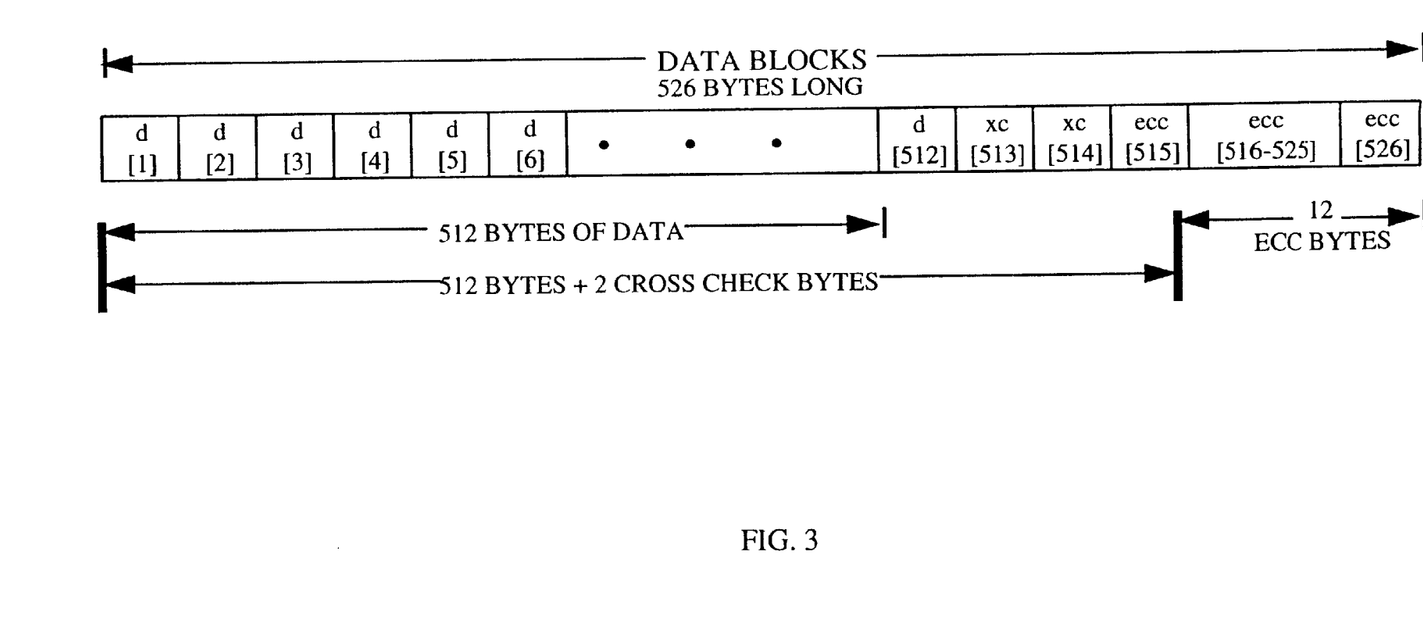
FIG. 3 illustrates the format of a data block written to a magnetic storage medium. The block includes 512 bytes of data, followed by two cross-check bytes, followed by 12 error correction bytes.

After the entire 512 bytes of data and the two cross-check bytes have been clocked through the ECC encoder 114, the ECC check bytes (labeled "ECC" in the figure) generated by the encoder 114 are output to multiplexer 120. At this point, the logical state of the select line 123 of the multiplexer 120 is switched to permit the ECC check bytes to pass through the multiplexer 120 to be written to the storage medium 122 in conventional fashion. As is shown in FIG. 3, the ECC check bytes, together with the previously written data bytes and cross-check bytes, form a single Reed-Solomon code word in the storage medium 122. An exemplary 526 byte code word written to the storage medium 122 has 512 bytes of data, i.e., one sector, followed by two cross-check bytes, xc[513] and xc[514] followed by 12 ECC bytes, ecc[515] through ecc[526] as illustrated in FIG. 3.

The number of ECC check bytes generated for each data block is determined by the particular ECC generator polynomial that is implemented in the ECC encoder circuit 114. An example of an ECC encoder which produces 12 ECC check bytes (four per data interleave) for each 512 byte sector of data is illustrated in the referenced Peterson et al. patent and the reader is referred to that patent for further details on the ECC encoding process. As an alternative to supplying the newly determined cross-check bytes, XCHK', to the input of the ECC encoder 114 at the end of the data sector, the cross-check bytes, XCHK, generated by the cross-check encoder 104 in the interface 101 may be clocked out of the buffer 108 following their associated data block, and input into the ECC encoder 114.

The data integrity check is performed by a comparison of the newly generated XCHK' bytes and the XCHK bytes that were written to the buffer 108. This comparison is performed over the last two byte clock cycles when the XCHK' bytes output from the ECC cross-check encoder 116 and the XCHK bytes from the buffer 108 are both delivered to the input of the comparison circuit 118 which performs a bitwise XOR operation on these byte values to determine equivalency. If the XCHK' and XCHK bytes do not compare, i.e., the bitwise XOR yields a non-zero result, one or more data errors within the buffer 108 are assumed to have occurred. In this case, an error flag may be asserted and sent to the micro-controller 112. When the micro-controller receives the error flag it may cause a request to be sent to the host 100 through the interface 101 to resend the erroneous data sector.

Referring now to FIG. 2, the use of the cross-check code to protect buffered data in the read path is similar to the operation of the code in the write path, only in the reverse direction.

In a preferred embodiment, data sectors together with their associated cross-check and ECC redundancy, XCHK' and ECC, respectively, are read out from a surface of the storage medium 122 and input to the sequencer/controller 109 over a path 126. Once inside the sequencer/controller 109, the path 126 splits into three parallel paths 127, 128 and 129, which are connected to the ECC block 130, the ECC cross-check block 131 and directly to the block buffer 108, respectively. As shown in FIG. 2, the data sectors and their associated cross-check bytes, XCHK', are passed directly to the buffer 108 under the control of the buffer controller 110 and the supervisory micro-controller 112.

Thus, in this example, the cross-check bytes appended to the data blocks in the buffer 108 are preferably not regenerated within the sequencer/controller 109, but instead are passed directly from the storage medium 122 to the buffer 108. The reason for this relates to the ability of the main ECC, with the assistance of micro-controller 112, to go into the buffer 108 to physically correct errors in the cross-check bytes, XCHK', that have been recovered from the storage medium. This will be explained in more detail below.

Simultaneous with the transfer of data and cross-check bytes from the storage medium 122 to the buffer 108, the data in each sector is also sequentially clocked, one byte at a time, through the ECC block 130 and the ECC cross-check block 131. As illustrated in FIG. 2, the entire Reed-Solomon code word from the storage medium 122, i.e., data, plus cross-check bytes, XCHK', plus ECC check bytes, ECC, are input into ECC block 130 while only data plus cross-check bytes, XCHK', are input into the ECC cross-check block 131. While the ECC block 130 and the ECC cross-check block 131 preferably share the same circuitry as the ECC encoder 114 and ECC cross-check encoder 116 in the write path (see FIG. 2), different reference numerals are used for these circuits to indicate that they may include additional circuitry to produce ECC and cross-check syndromes rather than merely remainder values at their output, as would be the case if these circuits simply re-encoded the data together with the received check bytes. In the case of an ECC block 130 that generates remainder values, such as disclosed in Peterson et al. a micro-controller executed firmware routine may be initiated to convert remainder values to syndrome values.

In either case, whether generated in hardware or with a micro-controller 112 executed firmware assist, the ECC and cross-check syndromes are required to perform error correction. The ECC syndrome values may then be solved as described in the Peterson et al. patent to yield error values and location values which are used to correct erroneous data as well as erroneous cross-check bytes in the buffer 108. The cross-check syndromes are used to detect miscorrection by the ECC and may be generated as taught in U.S. Pat. No. 5,422,895 to Nguyen et al.

As previously mentioned, if data errors are detected within a data block in the buffer, they may be corrected by the ECC as long as the number of detected errors is within the correction capability of the particular ECC code utilized. When data errors occur, although the cross-check syndromes must be reconstituted, as disclosed in the referenced Nguyen et al. patent, to correctly perform their cross-check function (because they are based on erroneous data), the same is not true of the cross-check redundancy appended to an erroneous data block in the buffer 108. This is because the cross-check bytes in the buffer 108 preferably come straight from the storage medium 122 and are not regenerated in the sequencer/controller 109 from the data block recovered from the storage medium 122 with errors.

In the case of errors in the cross-check bytes themselves, the ECC has capability to detect these errors and physically access the buffer 108 to correct them, just as it did with respect to data byte errors. This capability ensures that the correct cross-check bytes, XCHK', are appended to the data blocks temporarily stored in the buffer 108.

After any error correction routines that may be required are performed, data sectors plus their appended XCHK' bytes are sequentially clocked out of the buffer 108 over a path 132 to the interface circuit 101 under the control of the buffer controller 110. The path 132 connects the buffer 108 output to the cross-check generation circuit 116, a comparison circuit 124 and FIFO 102.

The individual data bytes of the data blocks input to the FIFO 102 are output to the host 100 according to the data rate of the interface 101. These data bytes are also sequentially clocked into the cross-check encoder circuit 104 where they are re-encoded according to the cross-check encoding algorithm previously described. The cross-check encoder 104 produces two cross-check redundancy bytes, XCHK", at its output after all 512 bytes of data from the buffer 108 have been clocked through its encoding circuity.

The data integrity check at the host interface 101 is performed by a comparison of the XCHK" bytes generated by the interface cross-check encoder 104 and the XCHK' bytes stored in the buffer 108. This comparison is performed over the last two byte clock cycles for each buffered code word, i.e., 512 bytes of data plus two cross-check bytes, when the XCHK" bytes output from the interface cross-check encoder 104 and the XCHK' bytes incoming from the buffer 108 over path 132 arrive at the input of the comparison circuit 118. If the XCHK" and XCHK bytes do not compare, i.e., are not equivalent, one or more data errors within the buffer 108 are assumed to have occurred. In this case, an error flag from the comparison circuit 124 may be sent to micro-controller 112. When the micro-controller 112 receives the error flag it may cause a request to be sent to the sequencer/controller 109 to reread the erroneous data sector.

Although it is possible for a Reed-Solomon based cross-check code to actually correct errors detected during the data integrity check, (according to the well known properties of Reed-Solomon codes), the relative ease of either requesting the host 101 to resend the information, in the case of data errors that occur in the buffer 108 during the write process, or, rereading the data from the storage medium 122 in the case of data errors that occur in the buffer 108 during the reading process, makes the institution of such a correction routine entirely optional.

Ordinarily, the maximum block length that may be protected by application of a Reed-Solomon based data integrity code, is determined by the expression $2^m-1$, which defines the "natural block length" of an m bit Reed-Solomon code. The distance properties of Reed-Solomon codes provide that for data blocks having fewer symbols (including appended redundancy) than the natural block length, the distance between any two code words is equal to r+1 symbols. Thus, for the present 8 bit Reed-Solomon code example that generates two redundant bytes (r=2), any two non-identical code words are guaranteed to differ by at least three bytes, provided that the code word is less than the natural block length of 255 bytes. Under this scenario, all combinations of single and two byte errors within the protected 255 byte block are detectable. There are, however, certain combinations of three byte errors that are undetectable.

If, on the other hand, the natural block length constraint for the disclosed 8 bit data integrity code is exceeded, there are certain combinations of two byte errors that will be undetectable. All single byte errors, however, remain detectable. This particular property may be taken advantage of in the context of a data integrity code used to protect a DRAM buffer as disclosed herein where the raw bit error rate associated with the DRAM is sufficiently low (typically on the order of $10^{-12}$ or less) to warrant the extension of the code over data blocks that exceed the natural block length. For the present 8 bit coding example, it has been statistically determined that two bytes of Reed-Solomon redundancy may be used to protect up to sector size (i.e., 512 bytes) blocks of data in the DRAM while providing a block undetectable error rate of approximately $10^{-20}$.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. For example, many variations on the cross-check code utilized both in terms of the length of the symbol code, such as 10 or 16 bit symbol codes, and the number of redundant symbols generated are possible.

Thus, the disclosure and the description herein are purely illustrative and are not intended to be in any sense limiting.

What is claimed is:

1. A method of protecting a data block temporarily stored in a buffer memory within a data path between a host and a storage medium comprising the steps of:
   (a) communicating the data block to a first cross-check encoder and to the buffer memory;
   (b) encoding the data block in said first cross-check encoder according to a cross-check code to generate a first cross-check redundancy for the data block;
   (c) appending said first cross-check redundancy to the data block in the buffer memory;
   (d) communicating the data block from the buffer to a second cross-check encoder;
   (e) re-encoding the data block in said second cross-check encoder according to said cross-check code, said second cross-check encoder generating a second cross-check redundancy for the data block; and
   (f) comparing said appended first cross-check redundancy to said second cross-check redundancy to determine whether the data block contains one or more errors,
   wherein the steps of encoding in said first cross-check encoder and re-encoding in said second cross-check encoder provide data integrity on both sides of the buffer memory within the data path.

2. The method of claim 1 further comprising the step of utilizing said second cross-check encoder and said cross-check code to detect miscorrections of the data block after an error correction process has been performed in accordance with an error detection code on an erroneous block of data recovered from a magnetic recording medium.

3. The method of claim 2 wherein said cross-check code is a Reed-Solomon code characterized by a generator polynomial, g(x), of the form: $x^2+\text{alpha}^{134}x+\text{alpha}^1$, and wherein said code operates over a Galois field having 256 elements, said Galois field defined by an irreducible polynomial $p(x)=x^8+x^4+x^3+x^2+1$ and a primitive $\text{alpha}^1$ element equal to 2B in hexadecimal.

4. The method of claim 3 wherein the data block comprises 512 bytes of data and said first and said second cross-check encoders generate two bytes of cross-check redundancy.

5. The method of claim 1 wherein said first cross-check encoder is implemented in an interface circuit in a disk drive storage system, and said second cross-check encoder is implemented in a data sequencer of said storage system.

6. The method of claim 1 wherein said comparing step is performed by a bitwise logical exclusive or operation on corresponding bits of said first cross-check redundancy and said second cross-check redundancy.

7. The method of claim 2 further comprising the step of transmitting the data block to a first-in-first-out shift register prior to communicating the data block to the buffer memory.

8. The method of claim 1 further comprising the steps of: writing the data block with said cross-check redundancy appended thereto to a surface of a magnetic storage medium to form a code word on said storage medium; reading said code word from said surface of said medium and communicating said code word to the buffer memory; communicating a data block portion of said code word from the buffer to a host and to said second cross-check encoder; generating a new cross-check redundancy from said data block portion in said second cross-check encoder; and, comparing said new cross-check redundancy to said cross-check redundancy written to the buffer to determine whether an error has occurred.

9. A method of utilizing a cross-check code to protect a data block temporarily stored in a block buffer memory within a data channel between a host system and a storage medium comprising the steps of:

(a) transmitting the data block to the buffer;

(b) encoding the data block in a first cross-check encoder located in the data channel before the buffer in accordance with the cross-check code to generate a first cross-check redundancy for the data block;

(c) appending said first cross-check redundancy to the data block in the buffer;

(d) transmitting the data block together with appended first cross-check redundancy to a second cross-check encoder in the data channel;

(e) encoding the data block in said second cross-check encoder in accordance with the cross-check code to generate a second cross-check redundancy for the data block; and (f) comparing said first cross-check redundancy with said second cross-check redundancy to determine whether the data block contains an errors, wherein the steps of encoding in said first cross-check encoder and encoding in said second cross-check encoder provide data integrity on both sides of the buffer memory within the data channel.

10. The method of claim 9 wherein said cross-check code is a Reed-Solomon code characterized by a generator polynomial, g(x), of the form: $x^2 + alpha^{134}x + alpha^1$, and wherein said cross-check code operates over a Galois field having 256 elements, said Galois field defined by an irreducible polynomial $p(x) = x^8 + x^4 + x^3 + x^2 + 1$ and a primitive $alpha^1$ element equal to 2B in hexadecimal.

11. The method of claim 10 wherein the data block comprises 512 bytes of data and said first and said second cross-check encoders each generate two bytes of cross-check redundancy.

12. The method of claim 9 wherein said first cross-check encoder is implemented in an interface circuit in a disk storage drive, and said second cross-check encoder is implemented as part of a data sequencer circuit in said storage system.

13. The method of claim 9 further comprising the steps of: writing the data block with said appended cross-check redundancy to a surface of a magnetic storage disk to form a code word on said storage medium surface; reading said code word from said surface of said medium and transmitting said code word to the buffer; transmitting a data block portion of said code word from the buffer to said second cross-check encoder and to a host through a first-in-first-out shift register; generating a new cross-check redundancy from said data block portion in said second cross-check encoder; and comparing said new cross-check redundancy to said cross-check redundancy written to the buffer from said medium to determine whether an error has occurred.

14. Apparatus for protecting data blocks temporarily stored in a block buffer memory between a host system and a storage medium comprising:

a first cross-check encoder implementing a cross-check code, said first encoder receiving the data blocks to be protected from a host on a first data path and from the buffer on a second data path;

a second cross-check encoder implementing said cross-check code, said second encoder receiving data blocks from the buffer on said first data path and from a communication channel on said second data path;

a first comparison circuit connected to said first cross-check encoder and to the buffer; and a second comparison circuit connected to said second cross-check encoder and to the buffer, wherein the first cross-check encoder and the second cross-check encoder provide data integrity on both sides of the buffer memory.

15. Apparatus as in claim 14 wherein said first and said second data paths are the write and read paths, respectively, in a disk storage drive.

16. Apparatus as in claim 14 further comprising a buffer controller electrically connected to said buffer, said buffer controller sending signals to said buffer to control data block flow through said buffer.

17. Apparatus as in claim 15 wherein said communication channel receives data blocks recovered from a surface of a magnetic recording disk and transmits the blocks to a data sequencer circuit having contained therein said second cross-check encoder.

18. Apparatus as in claim 15 further comprising a first-in-first out ("FIFO") shift register electrically connected to said buffer and to said host, said FIFO receiving data blocks from said host and transmitting the data blocks to the buffer on said first data path and receiving data blocks from the buffer and transmitting the data blocks to said host on said second data path.

19. Apparatus as in claim 14 further comprising an error correction coding ("ECC") circuit and an ECC cross-check circuit associated with said ECC circuit, and wherein said second cross-check encoder shares encoder circuitry with said ECC cross-check circuit.

20. Apparatus as in claim 19 wherein said cross-check code is a Reed-Solomon code characterized by a generator polynomial $g(x) = x^2 + alpha^{134}x + alpha^1$, and wherein said cross-check code operates over a 256 element Galois field, said Galois field defined by an irreducible polynomial $p(x) = x^8 + x^4 + x^3 + x^2 + 1$ and a primitive $alpha^1$ element equal to 2B in hexadecimal.

21. Apparatus as in claim 14 wherein said first comparison circuit comprises an array of exclusive or ("XOR") gates that performs a bitwise logical XOR operation on cross-check redundancy symbols received from said first cross-check encoder and corresponding cross-check redundancy symbols received from the buffer on said second data path.

22. Apparatus as in claim 21 wherein said second comparison circuit comprises an array of XOR gates that performs a bitwise logical XOR operation on cross-check redundancy symbols received from said second cross-check encoder and corresponding cross-check redundancy symbols received from the buffer on said first data path.

23. Apparatus as in claim 22 wherein said buffer is a dynamic random access memory.

24. Apparatus for protecting data blocks in a block buffer memory in a bi-directional data path between a host system and a storage medium utilizing a cross-check code, the apparatus comprising:

a first cross-check encoder receiving data blocks from a host in a first data path direction and from the buffer in a second data path direction, said first cross-check encoder producing cross-check redundancy for each data block in accordance with the cross-check code;

a second cross-check encoder receiving data blocks from the buffer in said first data path direction and from a data storage medium in said second direction, said second cross-check encoder generating cross-check redundancy for each data block in accordance with the same cross-check code;

a first comparison circuit connected to said first cross-check encoder and to the buffer, said first comparison circuit comparing redundancy generated by said first and said second cross-check encoders in said second data path direction to detect errors in the data block in said second data path direction; and a second comparison circuit connected to said second cross-check encoder and to the buffer, said second comparison circuit comparing redundancy generated by said first and said second cross-check encoders to detect errors in the data block in said first data path direction, wherein the first cross-check encoder and the second cross-check encoder provide data integrity on both sides of the buffer memory within the bi-directional data path.

25. Apparatus as in claim 24 further comprising an ECC cross-check circuit and wherein said second cross-check encoder shares encoder circuitry with said ECC cross-check circuit.

26. Apparatus as in claim 24 wherein said cross-check code is a Reed-Solomon code characterized by a generator polynomial $g(x)=x^2+alpha^{134}x+alpha^1$, and wherein said cross-check code operates over a 256 element Galois field, said Galois field defined by an irreducible polynomial $p(x)=x^8+x^4+x^3+x^2+1$ and a primitive $alpha^1$ element equal to 2B in hexadecimal.

27. Apparatus as in claim 24 wherein said first and said second data path directions correspond to the write and read paths, respectively, in a disk storage drive.

28. Apparatus as in claim 24 wherein said buffer is a dynamic random access memory.

* * * * *